(12) United States Patent
Tomioka

(10) Patent No.: US 7,688,586 B2
(45) Date of Patent: Mar. 30, 2010

(54) ELECTRONIC DEVICE AND HEAT CONDUCTION MEMBER

(75) Inventor: Kentaro Tomioka, Sayama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/025,606

(22) Filed: Feb. 4, 2008

(65) Prior Publication Data

US 2008/0198547 A1 Aug. 21, 2008

(30) Foreign Application Priority Data

Feb. 16, 2007 (JP) ............................. 2007-036912

(51) Int. Cl.
*H05K 7/20* (2006.01)
*F28F 7/00* (2006.01)
*F28F 3/02* (2006.01)

(52) U.S. Cl. ..................... 361/695; 165/80.2; 165/80.3; 165/185; 165/121; 361/679.47; 361/679.54; 361/704; 361/708

(58) Field of Classification Search ........................ None
See application file for complete search history.

(56) References Cited

U.S. PATENT DOCUMENTS 4,985,805 A * 1/1991 Riedel et al. ................ 361/704
5,390,734 A * 2/1995 Voorhes et al. .............. 165/185
5,661,637 A * 8/1997 Villaume ................ 361/679.47
6,542,370 B1 * 4/2003 Wang et al. .................. 361/704
6,621,698 B2 * 9/2003 Chang ................... 361/679.47
7,319,590 B1 * 1/2008 Ingram ........................ 361/704
2003/0043544 A1* 3/2003 Nelson et al. ............... 361/690
2005/0111189 A1* 5/2005 Smalc et al. ................ 361/700
2005/0128709 A1* 6/2005 Fujiwara ..................... 361/704
2006/0126304 A1* 6/2006 Smalc et al. ................ 361/704

FOREIGN PATENT DOCUMENTS

| JP | 10-39955 | 2/1998 |
|---|---|---|
| JP | 2005-77979 | 3/2005 |
| JP | 2006-130753 | 5/2006 |

* cited by examiner

*Primary Examiner*—Gregory D Thompson
(74) *Attorney, Agent, or Firm*—Blakely, Sokoloff, Taylor & Zafman LLP

(57) ABSTRACT

According to one embodiment, an electronic device includes a case, a heat generation body mounted in the case, a cooling member mounted in the case, and a heat conduction member. The heat conduction member includes a heat receiving section opposed to the heat generation body and thermally connected to the heat generation body, a heat radiation section opposed to the cooling member, and a section provided between the heat receiving section and the heat radiation section. The heat conduction member is formed by laminating a plurality of sheet members each having thermal conductivity. The plurality of sheet members are joined together in a portion of the heat conduction member.

16 Claims, 14 Drawing Sheets

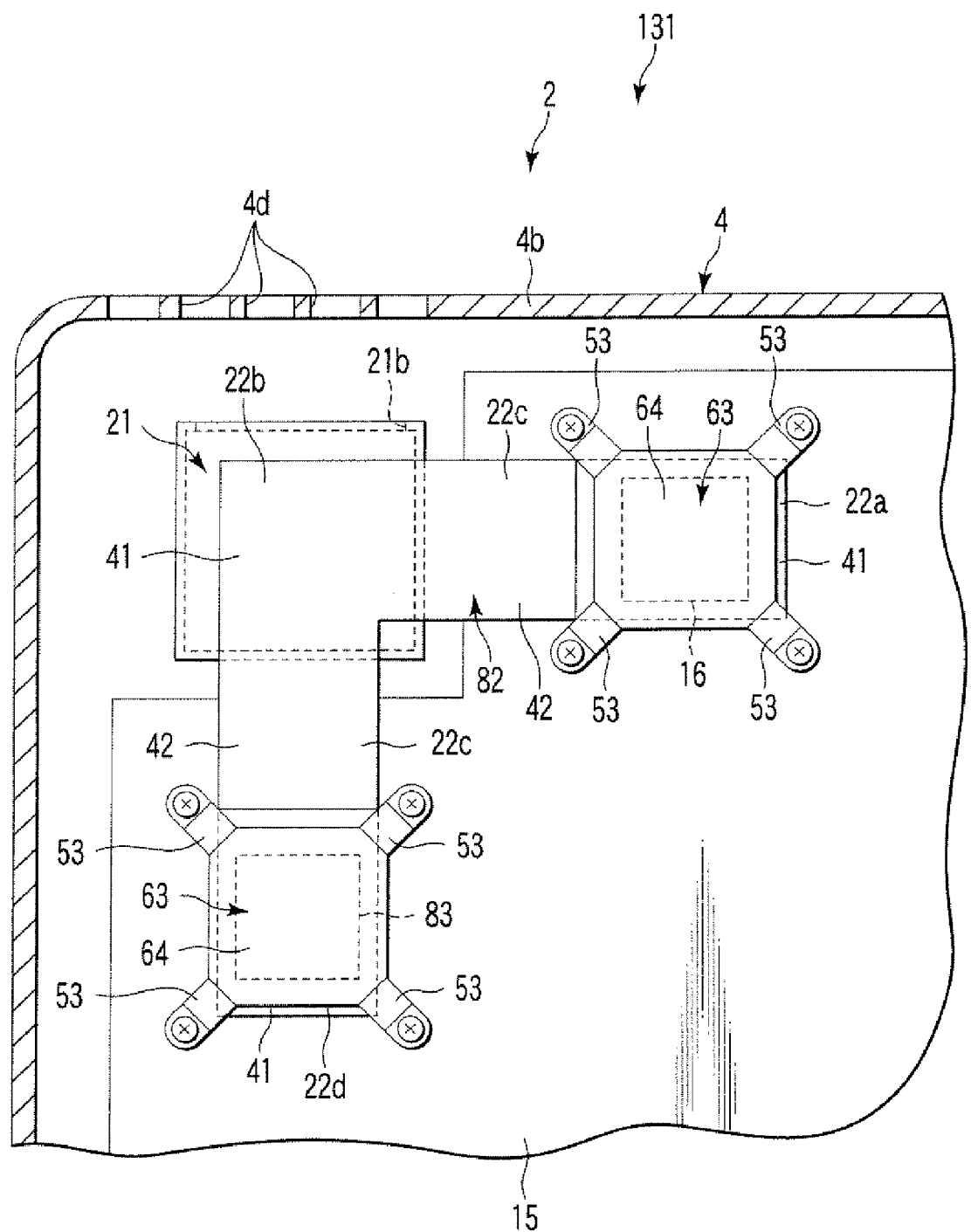
F I G. 14

ELECTRONIC DEVICE AND HEAT CONDUCTION MEMBER

CROSS-REFERENCE TO RELATED APPLICATIONS

This application is based upon and claims the benefit of priority from Japanese Patent Applications No. 2007-036912, filed Feb. 16, 2007, the entire contents of which are incorporated herein by reference.

BACKGROUND

1. Field

One embodiment of the invention relates to a heat conduction member which transfers part of heat generated by a heat generation body to a region located out of the heat generation body, and an electronic device provided with the heat conduction member.

2. Description of the Related Art

The electronic device such as a portable computer contains a heat generation body such as a CPU and a north bridge (trade mark). An example of a cooling unit, which promotes the cooling of the heat generation body, includes a cooling fan, heat radiation fins, and a heat conduction member which transfers part of heat generated by the heat generation body to the heat radiation fins. A typical example of the heat conduction member is a heat pipe.

Jpn. Pat. Appln. KOKAI Publication No. 2005-77979 discloses a liquid crystal panel heat radiation structure having a heat conduction member. The liquid crystal panel heat radiation structure includes a panel heat transfer member attached with a liquid crystal panel, a panel heat sink, and a heat conduction member bridged between the panel heat transfer member and the panel heat sink. The heat conduction member is a carbon graphite sheet or a copper foil, and is flexible.

Since the heat conduction member has flexibility, unwanted reaction is little generated in the panel heat transfer member, and vibration and impact applied from outside are buffered. Therefore, distortion and displacement little occur in the liquid crystal panel.

The mounting height of the heat generation body varies depending on the kind and size of the heat generation body. The holding height of a heat radiation member also varies depending on the type of the electronic device. The heat conduction member such as the heat pipe is rigid. It is thus difficult to use one kind of the heat conduction member in the plurality of applications where the mounting heights of the heat generation bodies are different and the holding heights of the heat radiation members are different. The use of the heat conduction member is not versatile.

In recent electronic devices, a plurality of heat generation bodies requiring their cooling are frequently mounted in the case thereof. Accordingly, there has been demanded the heat conduction member capable of absorbing the difference among mounting heights of those heat generation bodies (called parts common difference). Thus, it is suitable that the heat conduction member used in recent electronic devices is flexible and is adjustable to the mounting height of the heat generation body.

The heat conduction member disclosed in Jpn. Pat. Appln. KOKAI Publication No. 2005-77979 is a carbon graphite sheet having a thickness of about 0.2 mm obtained by laminating thin carbon sheets, or a copper foil having a thickness of about 0.1 mm. When such a heat conduction member is used, it is difficult to secure thermal conductivity. The efficiency of the heat transfer from the panel heat transfer member to the panel heat sink is not high.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 14 is an exemplary cross-sectional view showing a portable computer according to a ninth embodiment of the present invention.

DETAILED DESCRIPTION

Various embodiments according to the invention will be described hereinafter with reference to the accompanying drawings. In general, according to one embodiment of the invention, an electronic device includes a case, a heat generation body mounted in the case, a cooling member mounted in the case, and a heat conduction member. The heat conduction member includes a heat receiving section opposed to the heat generation body and thermally connected to the heat generation body, a heat radiation section opposed to the cooling member, and a section provided between the heat receiving section and the heat radiation section. The heat conduction member is formed by laminating a plurality of sheet members each having thermal conductivity. The plurality of sheet members are joined together in a portion of the heat conduction member.

According to one embodiment of the invention, a conduction member includes a plurality of sheet members each having thermal conductivity. The sheet members are laminated and form the heat conduction member. Said plurality of sheet members are joined together in a portion of the heat conduction member.

Embodiments of the present invention will be described with reference to the accompanying drawings applied to a portable computer.

Figure 1:
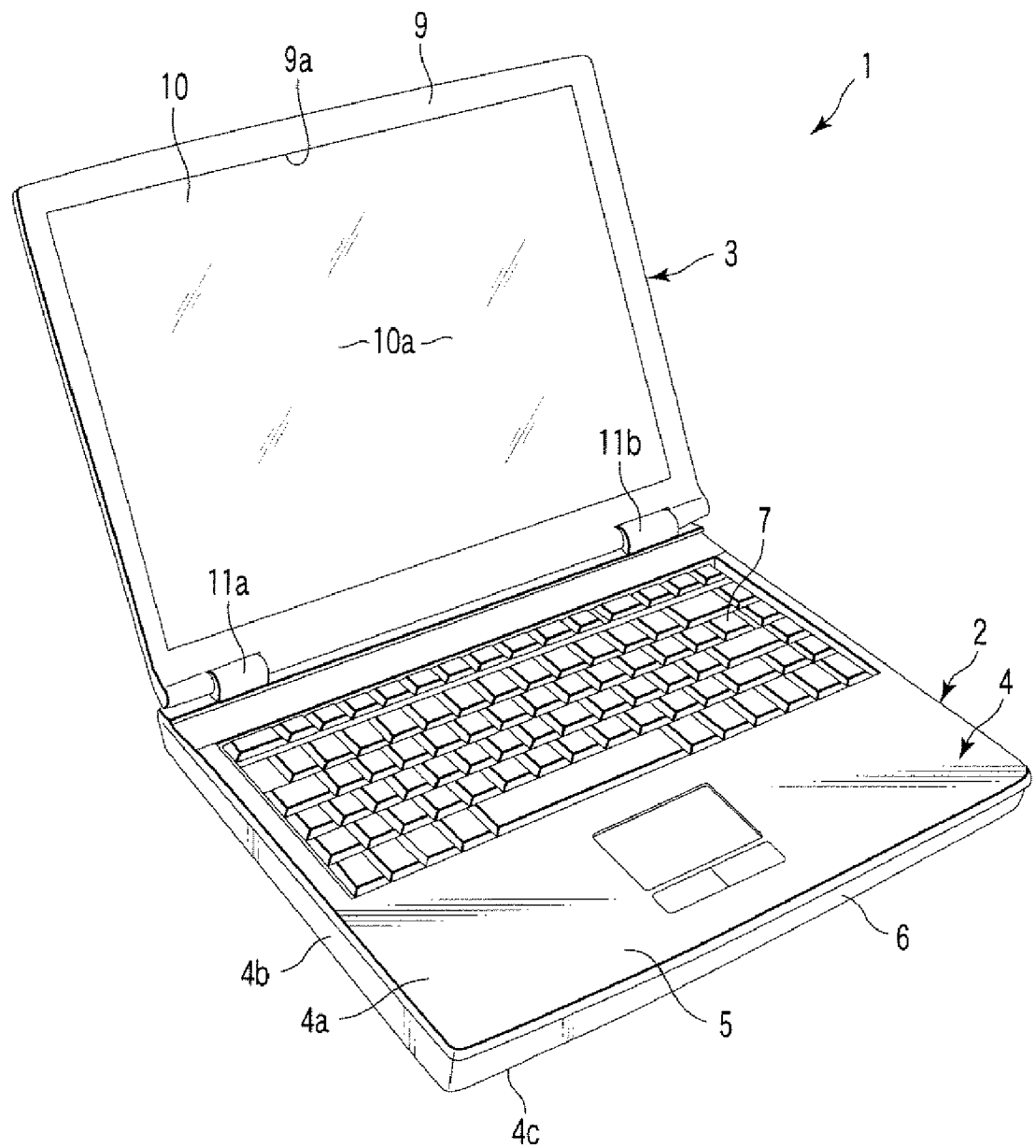
FIG. 1 is an exemplary perspective view showing a portable computer according to a first embodiment of the present invention.

FIGS. 1 to 5 show a portable computer 1 as an electronic device according to a first embodiment of the present invention. As shown in FIG. 1, the portable computer 1 includes a main body 2 and a display unit 3.

The main body 2 has a case 4 shaped like a box. The case 4 includes an upper wall 4a, a circumferential wall 4b and a lower wall 4c. The case 4 is divided into a case cover 5 including the upper wall 4a and a case base 6 including the lower wall 4c. The case cover 5 is applied to the case base 6 from above and detachably supported by the case base 6. The upper wall 4a supports a keyboard 7. A plurality of air outlet apertures 4d, for example, are opened in the circumferential wall 4b (see FIG. 2).

The display unit 3 includes a display housing 9 and a liquid crystal display (LCD) module 10 housed in the display housing 9. The LCD module 10 includes a display screen 10a. The display screen 10a is exposed to the outside of the display housing 9 through a front opening 9a of the display housing 9.

The display unit 3 is supported at the rear end part of the case 4 with the aid of a pair of hinges 11a and 11b. With this structure, the display unit 3 may be turned between a close position in which the upper wall 4a is covered from above and an open position in which the upper wall 4a is turned upward so as to expose the upper wall 4a.

Figure 2:
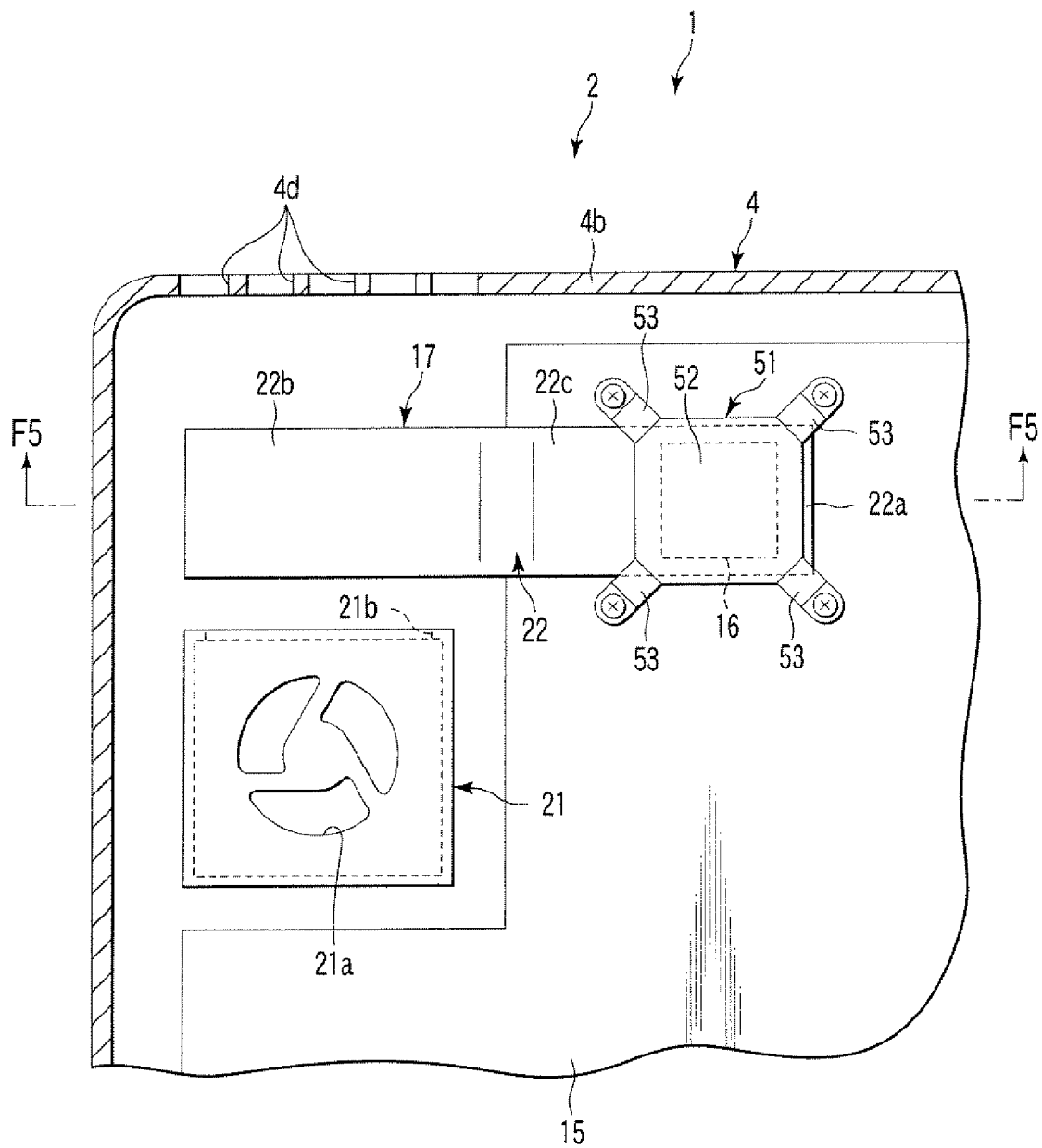
FIG. 2 is an exemplary cross-sectional view showing the portable computer according to the first embodiment.

As shown in FIG. 2, the case 4 of the main body 2 contains a printed circuit board 15, a heat generation body 16, and a cooling unit 17. The heat generation body 16 is mounted on the printed circuit board 15. An example of the heat generation body 16 is a CPU, a graphic chip, a north bridge, or a memory. It is noted that the heat generation body in the invention is not limited to the examples just mentioned, but involves various types of circuit components which require heat radiation therefrom.

The cooling unit 17 includes a cooling fan 21 and a heat conduction member 22. The cooling fan 21 of the embodiment is one form of a cooling member in the invention. The cooling fan 21, mounted in the case 4, is disposed facing the air outlet aperture 4d provided in the circumferential wall 4b. The cooling fan 21 includes air suction ports 21a and an air exhaust port 21b. The cooling fan 21 draws air inside the case 4 while at the same time discharging the drawn air to the air outlet apertures 4d of the case 4.

As shown in FIG. 2, an example of the heat conduction member 22 is rectangular in shape, and extends from a region opposed to the heat generation body 16 to a region opposed to the cooling fan 21. The heat conduction member 22 includes a heat receiving section 22a as a first section, a heat radiation section 22b as a second section, and a third section 22c.

The heat receiving section 22a is opposed to the heat generation body 16, and thermally connected to the heat generation body 16. A heat transfer member 25 is interposed between the heat receiving section 22a and the heat generation body 16 (see FIG. 5). The heat transfer member 25 may be heat transfer grease or a heat transfer sheet.

The heat radiation section 22b extends between the cooling fan 21 and the air outlet apertures 4d of the case 4. The heat radiation section 22b is opposed to the air exhaust port 21b of the cooling fan 21. The section 22c is an area located out of the heat receiving section 22a and the heat radiation section 22b of the heat conduction member 22. The section 22c in this embodiment is provided between the heat receiving section 22a and the heat radiation section 22b.

Figure 3:
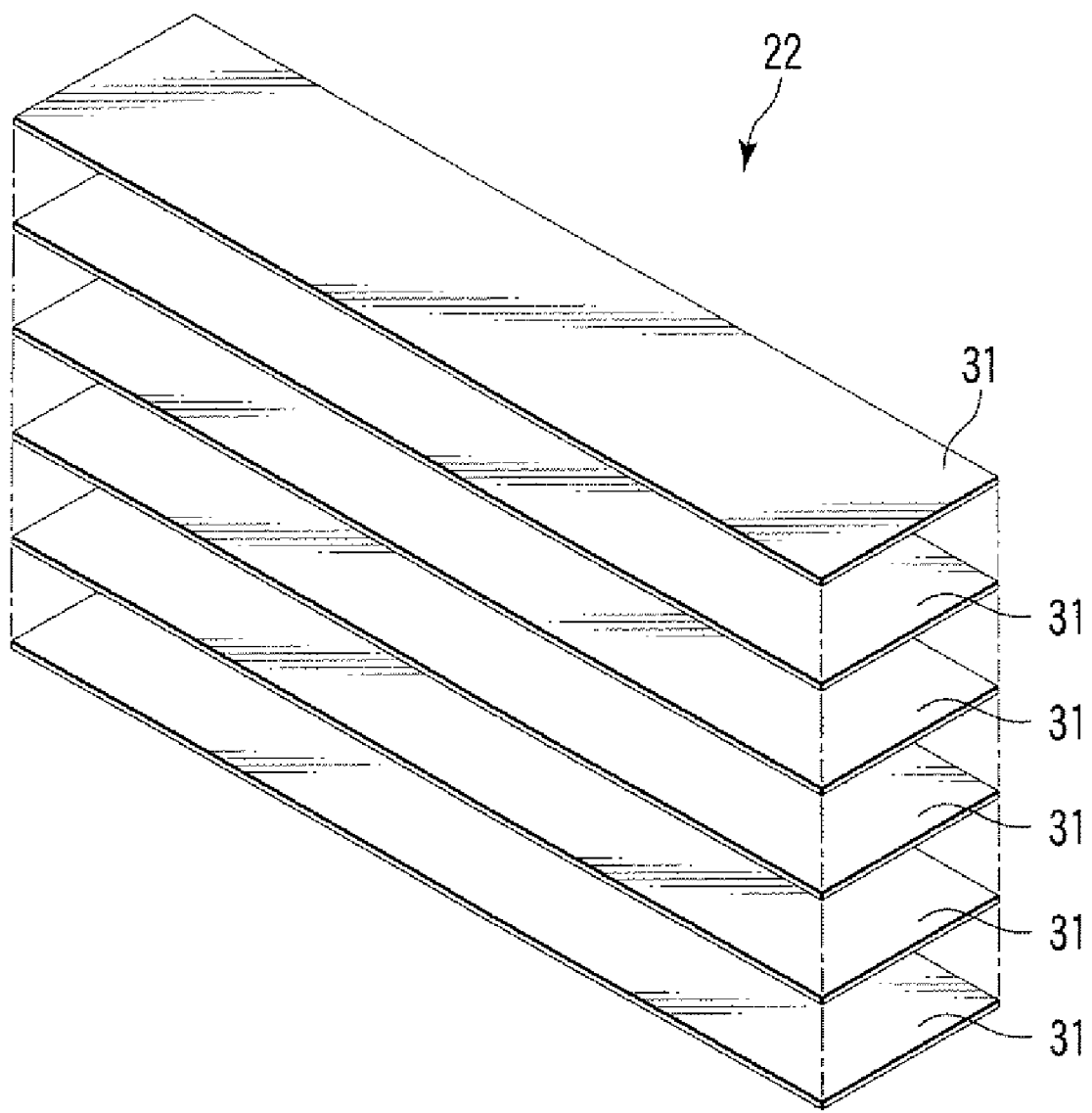
FIG. 3 is an exemplary exploded perspective view showing a heat conduction member according to the first embodiment.

As shown in FIG. 3, the heat conduction member 22 is formed by laminating a plurality of sheet members 31 each having a thermal conductivity. The sheet member 31 may be a carbon sheet. The sheet member 31 in the invention may also be a metal sheet such as a copper or aluminum foil. In the present embodiment, the sheet member 31 is a carbon sheet having a thickness of 0.1 to 0.2 mm and a high flexibility.

Figure 4:
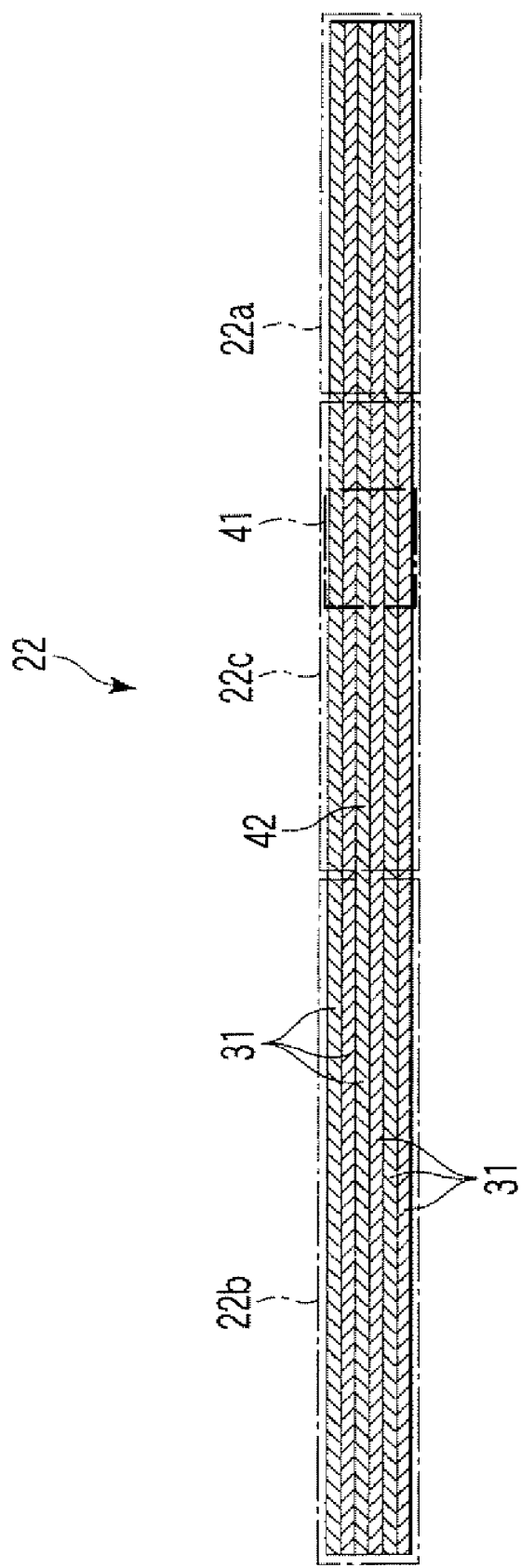
FIG. 4 is an exemplary cross-sectional view showing the heat conduction member according to the first embodiment.

As shown in FIG. 4, the plurality of laminated sheet members 31 are joined together only in a portion of the heat conduction member 22. In the heat conduction member 22 of this embodiment, the portion (to be referred to as a joining member 41) where said plurality of sheet members are joined together is provided in only in a portion of the section 22c. All the sheet members 31 are joined together into one bundle in the joining portion 41. The method for joining the sheet members 31 is not particularly limited. For example, a double-coated tape, adhesive, or welding may be used for the joining.

In a portion (to be referred to as a non-joining portion 42) which is located out of the joining portion 41, the plurality of sheet members 31 are not joined together. In the embodiment, the heat receiving section 22a, the heat radiation section 22b, and a remaining portion of the section 22c located out of the joining portion 41 are contained in the non-joining portion 42.

Figure 5:
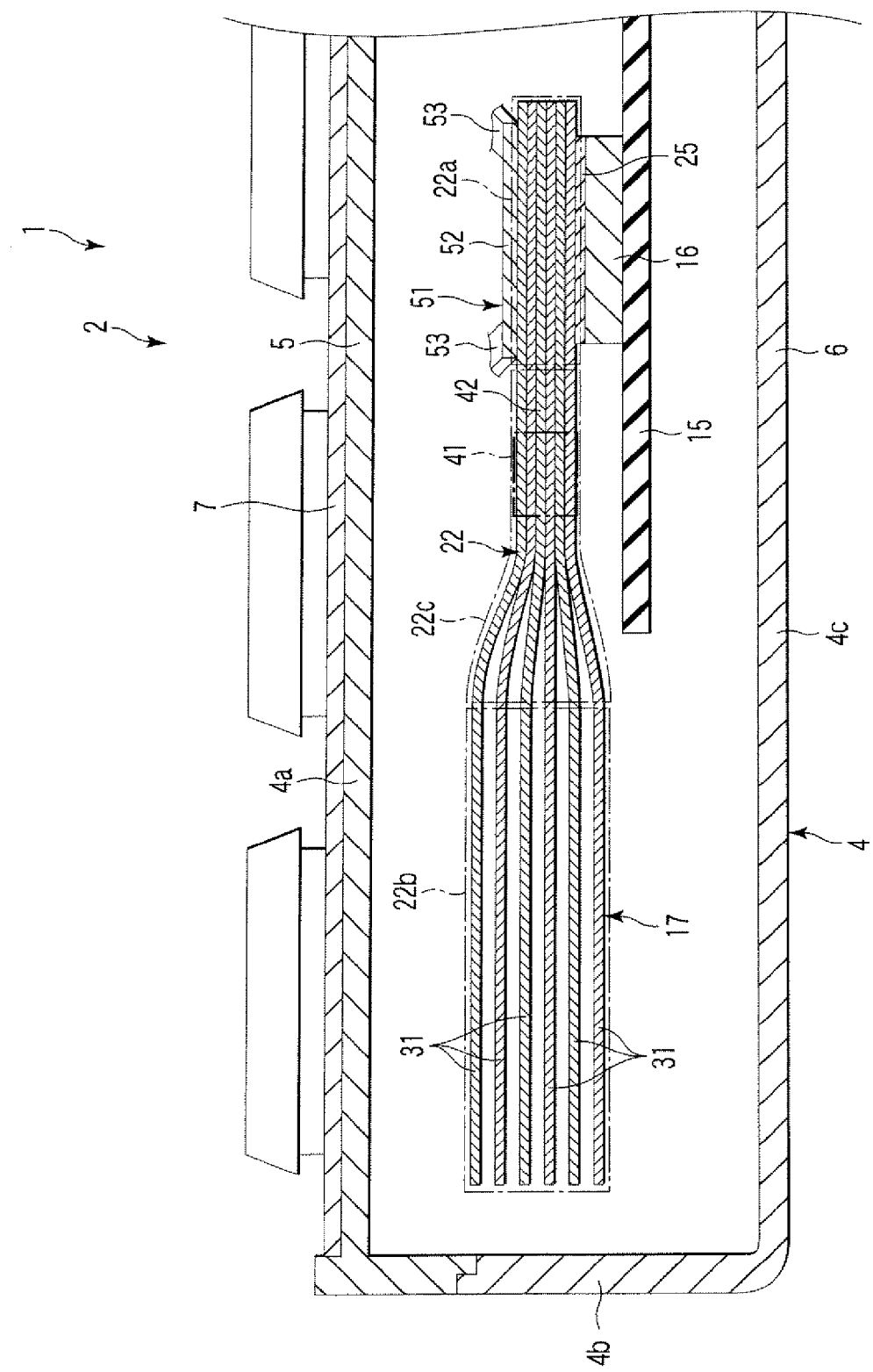
FIG. 5 is an exemplary cross-sectional view taken on line F5-F5 in the portable computer shown in FIG. 2.

As shown in FIG. 5, the heat receiving section 22a is pressed toward the heat generation body 16 by a pressing member 51. By the pressing member 51, the heat receiving section 22a is thermally connected to the heat generation body 16 firmly. And the plurality of sheet members 31 are thermally connected one another firmly. Nothing may be interposed between the adjacent sheet members 31 located in the heat receiving section 22a. A heat transfer material such as heat transfer grease may be interposed therebetween. In this case, the heat transfer performance is enhanced among the plurality of sheet members 31.

As shown in FIGS. 2 and 5, the pressing member 51 includes a pressing part 52 facing the heat conduction member 22 and legs 53 which are fixed to the printed circuit board 15 and support the pressing part 52. The pressing part 52 and the legs 53 cooperatively form a plate spring for pressing the heat conduction member 22. The pressing part 52 in the present embodiment is flat in shape and comes in contact with the substantially entire area of the heat receiving section 22a.

The heat radiation section 22b is held in a space facing the cooling fan 21 by, for example, a holding structure, not shown. As shown in FIG. 5, in the heat radiation section 22b, the plurality of sheet members 31 are arranged while being spaced from one another. A spacer (not shown) may be placed in each space between the adjacent sheet members 31. The heat radiation section 22b of the heat conduction member 22 forms heat radiation fins.

Operations of the portable computer 1 will now be described.

When the portable computer 1 is operated for use, the heat generation body 16 generates heat. Part of the heat generated by the heat generation body 16 is transferred to the heat receiving section 22a of the heat conduction member 22 through the heat transfer member 25. The heat having reached the heat receiving section 22a is almost entirely transferred to the plurality of sheet members 31 which are thermally coupled together in the heat receiving section 22a. The heat having been transferred to the sheet members 31 is transferred to the heat radiation section 22b through the section 22c.

The heat radiation section 22b of the heat conduction member 22 is forcibly cooled by the cooling fan 21. The heat having been transferred to the heat radiation section 22b is thus discharged to the outside of the case 4 by discharging an air stream from the cooling fan 21. In this way, cooling of the heat generation body 16 is promoted.

In the portable computer 1 thus constructed, the heat conduction member 22 has good thermal conductivity, and is adjustable to the mounting height of the heat generation body 16. Specifically, the heat conduction member 22 of the present embodiment is a lamination of the sheet members 31 having the thermal conductivity. Since the heat conduction member 22 includes the plurality of sheet members 31, the heat conduction member 22 has a good thermal conductivity.

The plurality of sheet members 31 are joined together only in a portion of the heat conduction member 22. Thus, the sheet members 31 are each deformable in the non-coupling portion 42 of the heat conduction member 22. In other words, in the non-joining portion 42, the sheet members 31 lose little flexibility, and thus retain a high flexibility.

In the case where the section 22c of the heat conduction member 22 is flexible, the heat conduction member 22 itself is deformable in conformity with the mounting height of the heat generation body 16. In other words, the heat conduction member 22 is adjustable to the mounting height of the heat generation body 16. Therefore, the heat conduction member 22 is hardly affected by the mounting height of the heat generation body 16 and the like and is universally applicable to various types of electronic devices.

Even when the heat pipe is used, for example, a relatively thick heat transfer sheet as the heat transfer member 25 is interposed between the heat generation body 16 and the heat pipe. By so doing, the heat pipe may be versatilely used without regard to the mounting height of the heat generation body 16. On the other hand, in the heat conduction member 22 of the present embodiment, the heat conduction member 22 is adjustable to the mounting height of the heat generation body 16. Therefore, the heat transfer grease having a smaller thermal resistance than the heat transfer sheet may be used for the heat transfer member 25. Thus, according to the heat conduction member 22, high thermal connection to the heat generation body 16 can be realized.

In the joining portion 41, the plurality of sheet members 31 are joined together by adhesive or the like. Accordingly, the joining portion 41 is relatively hard. In the case where the joining portion 41 is provided in a part of the section 22c as in the embodiment, the heat receiving section 22a and the heat radiation section 22b may be used as the non-joining portion 42.

The non-joining portion 42 is softer than the joining portion 41. In some types of the heat generation body 16, a die is mounted on the base substrate and the surface of the heat generation body 16 is irregular. In this case, if the heat receiving section 22a is soft, the heat receiving section 22a may be deformed in conformity with the surface configuration of the heat generation body 16. Therefore, the heat conduction member 22 may have a high thermal connection to the heat generation body 16.

In the case where the heat radiation section 22b is the non-joining portion 42, its heat radiation property may be enhanced by forming gaps among the plurality of sheet members 31. In the case where the joining portion 41 is provided in a portion of the section 22c, a remaining portion of section 22c which is located out of the joining portion 41 is deformable without any restriction. Accordingly, the heat conduction member 22 can secure a high flexibility.

The thermal conductivity of the carbon sheet is about three times that of the aluminum alloy, but its density is about the half of the latter. When the heat conduction member 22 is made of the carbon sheet, the resultant member is light in weight and excellent in thermal conductivity.

A portable computer 61 as an electronic device according to a second embodiment of the present invention will be described with reference to FIG. 6. In the second embodiment, like or equivalent portions will be designated by like reference numbers used in the portable computer 1 of the first embodiment, and the description thereof will be omitted.

Figure 6:
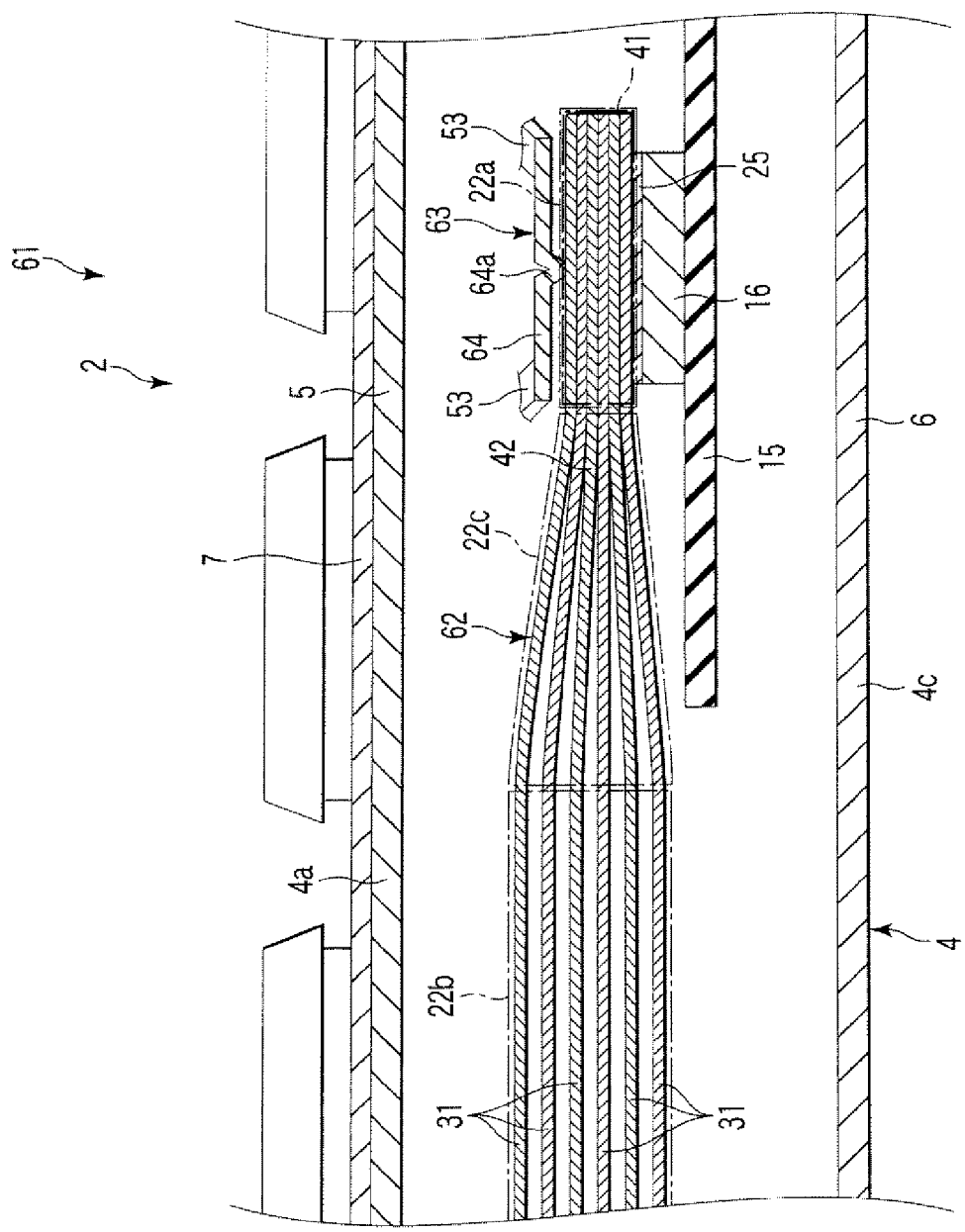
FIG. 6 is an exemplary cross-sectional view showing a portable computer according to a second embodiment of the present invention.

As shown in FIG. 6, the portable computer 61 includes a heat conduction member 62 and a pressing member 63. In the heat conduction member 62 in the present embodiment, the joining portion 41 is provided in the heat receiving section 22a. The heat radiation section 22b and the section 22c are both contained in the non-joining portion 42.

The pressing member 63 includes a pressing part 64 having a protruded part 64a protruding toward the heat conduction member 62 and legs 53. The protruded part 64a of the pressing part 64 is in contact with the heat conduction member 62. The pressing part 64 and the legs 53 cooperatively form a plate spring for pressing the heat conduction member 62 toward the heat generation body 16.

In the portable computer 61 having such a construction, the heat conduction member 62 is flexible. Accordingly, the heat conduction member 62 has good thermal conductivity, and is adjustable to the mounting height of the heat generation body 16.

As described above, the joining portion 41 is harder than the non-joining portion 42. In the case where the heat receiving section 22a is contained in the joining portion 41, use of the pressing member 63 including the protruded part 64a is allowed. In the case where the heat receiving section 22a is flexible, it is necessary to secure the contact area to some extent by forming the pressing part 52 to be flat as in the case of the pressing member 51 in the first embodiment.

In the case where the heat receiving section 22a is relatively hard in the present embodiment, the heat receiving section 22a may be supported at one point by the pressing member 63 including the protruded part 64a. The pressing force of the pressing member 63 including the protruded part 64a is more easily adjustable than that of the pressing member 51 of the flat type. Accordingly, it is possible to press the heat conduction member 62 toward the heat generation body 16 with a more appropriate force.

It is not essential to form the joining portion 41 over the entire area of the heat receiving section 22a. If required, it may be provided in a portion of the heat receiving section 22a.

A portable computer 71 as an electronic device according to a third embodiment of the present invention will be described with reference to FIG. 7. In the third embodiment, like or equivalent portions will be designated by like reference numbers used in the portable computers 1 and 61 in the first and second embodiments, and the description thereof will be omitted.

Figure 7:
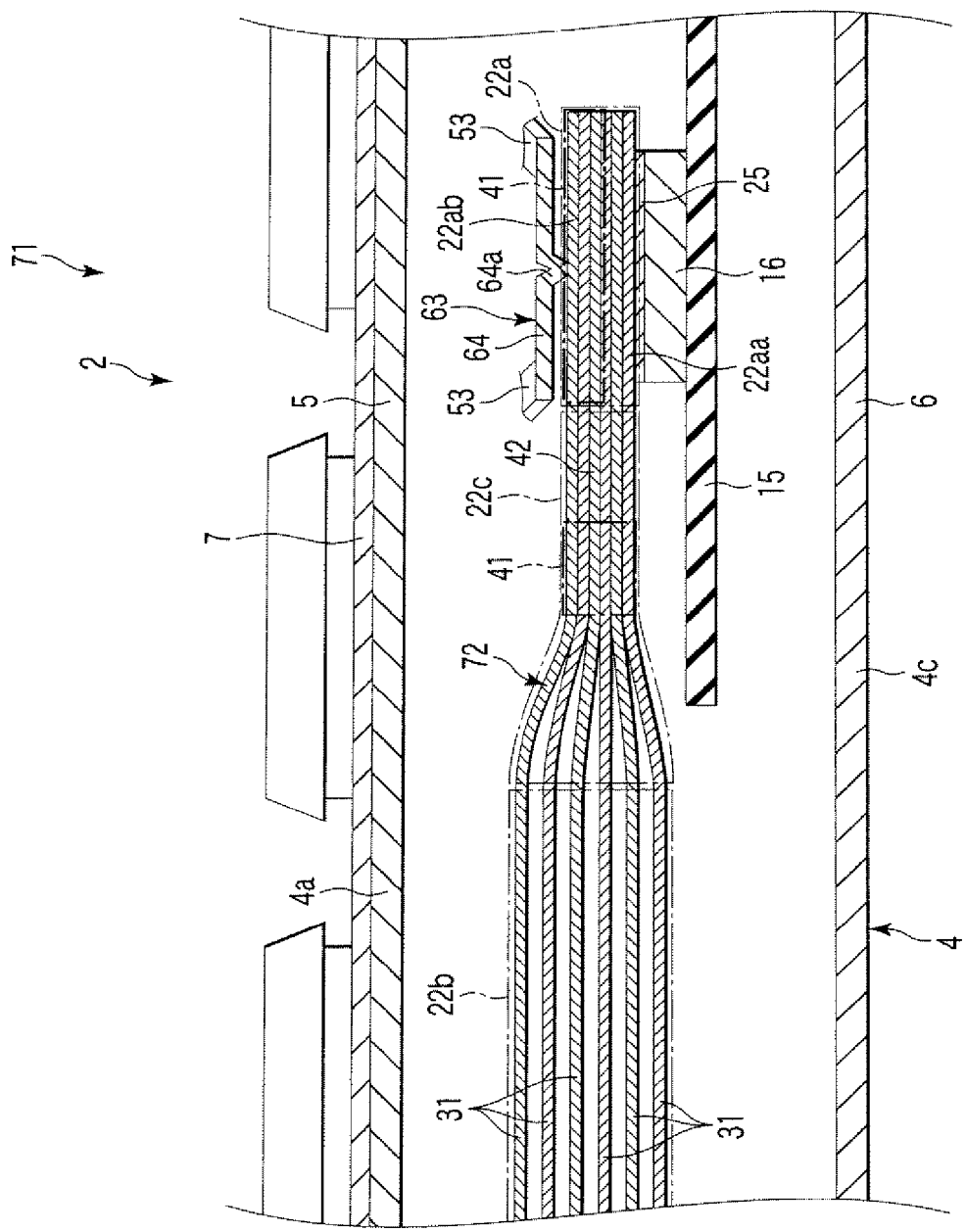
FIG. 7 is an exemplary cross-sectional view showing a portable computer according to a third embodiment of the present invention.

As shown in FIG. 7, the portable computer 71 includes a heat conduction member 72 and a pressing member 63. In the heat conduction member 72 of the embodiment, the joining portion 41 is formed in a portion of the section 22c. In this joining portion 41, all the sheet members 31 are joined together into one bundle.

The heat receiving section 22a of the heat conduction member 72 includes a first portion 22aa and a second portion 22ab. The first portion 22aa is opposed to the heat generation body 16 and corresponds to the lower half of the heat receiving section 22a, for example. The second portion 22ab is opposed to the pressing member 63 and corresponds to the upper half of the heat receiving section 22a, for example.

In the heat conduction member 72 of the embodiment, the joining portion 41 is provided also in the second portion 22ab of the heat receiving section 22a. The first portion 22aa of the heat receiving section 22a is contained in the non-joining portion 42.

In the portable computer 71 thus constructed, the heat conduction member 72 has a flexibility, so that the heat conduction member 72 has good thermal conductivity and is adjustable to the mounting height of the heat generation body 16.

In the structural arrangement where the first portion 22aa of the heat receiving section 22a is a part of the non-joining portion 42, the heat receiving section 22a may be deformed in conformity with the surface configuration of the heat generation body 16. As a result, the heat conduction member 72 has a high thermal connection to the heat generation body 16.

In the structural arrangement where the second portion 22b of the heat receiving section 22a is a part of the joining portion 41, the heat receiving section 22a may be supported at one point by using the pressing member 63 including the protruded part 64a. Accordingly, the heat conduction member 72 may be pressed toward the heat generation body 16 with a more appropriate pressing force.

In the structural arrangement where the second portion 22ab of the heat receiving section 22a is a part of the non-joining portion 42, the heat receiving section 22a may be supported at one point by using the pressing member 63 including the protruded part 64a. Accordingly, the heat conduction member 72 may be pressed toward the heat generation body 16 with a more appropriate pressing force.

It suffices that the joining portion 41 is provided in a portion of the heat conduction member 72, which is located out of the heat receiving section 22a. For example, the joining portion 41 may be provided in the heat radiation section 22b.

A portable computer 81 as an electronic device according to a fourth embodiment of the present invention will be described with reference to FIGS. 8 and 9. In the fourth embodiment, like or equivalent portions will be designated by like reference numbers used in the portable computers 1, 61 and 71 in the first to third embodiments, and the description thereof will be omitted. The portable computer 81 includes a heat conduction member 82.

Figure 8:
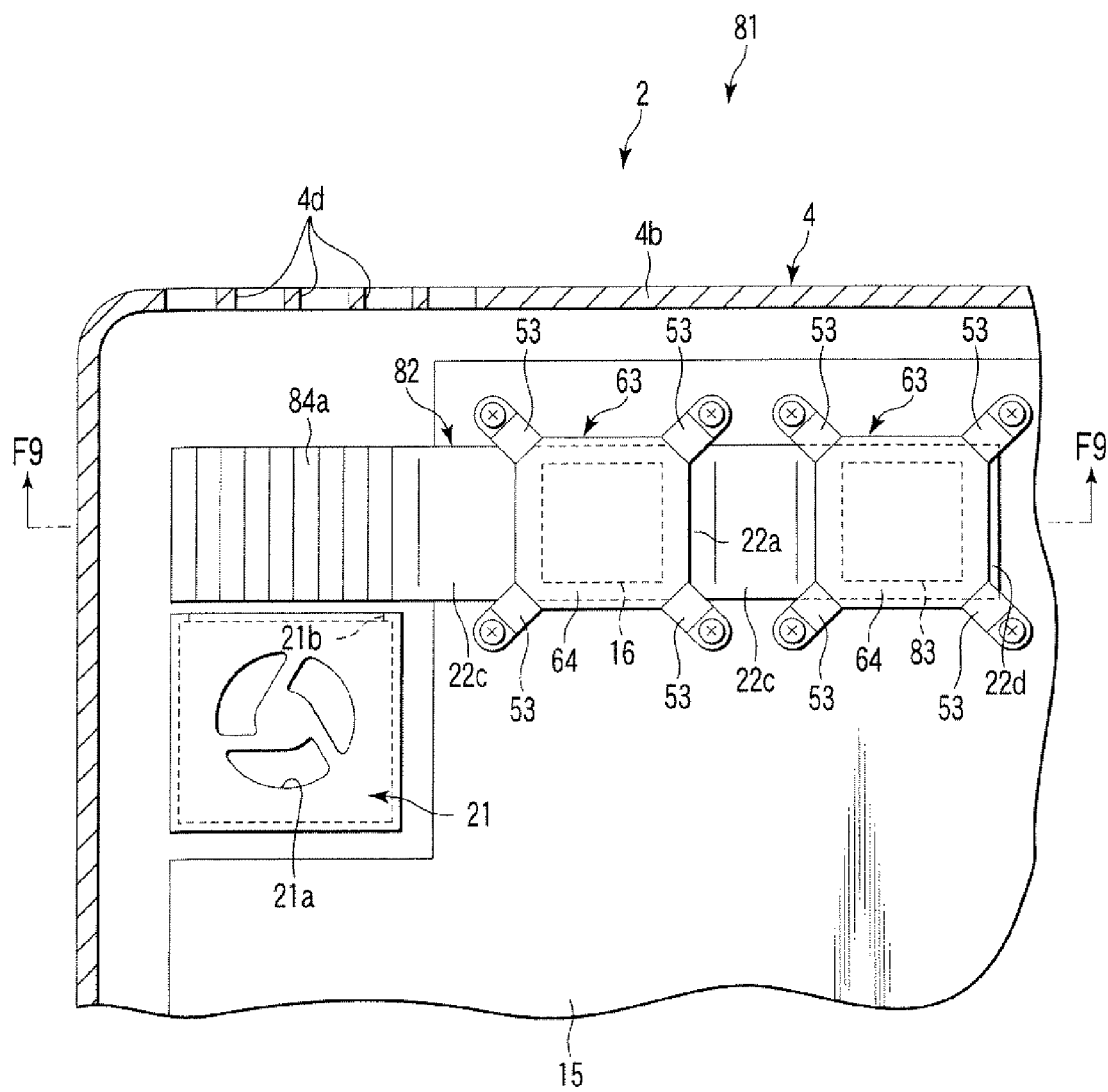
FIG. 8 is an exemplary cross-sectional view showing a portable computer according to a fourth embodiment of the present invention.
Figure 9:
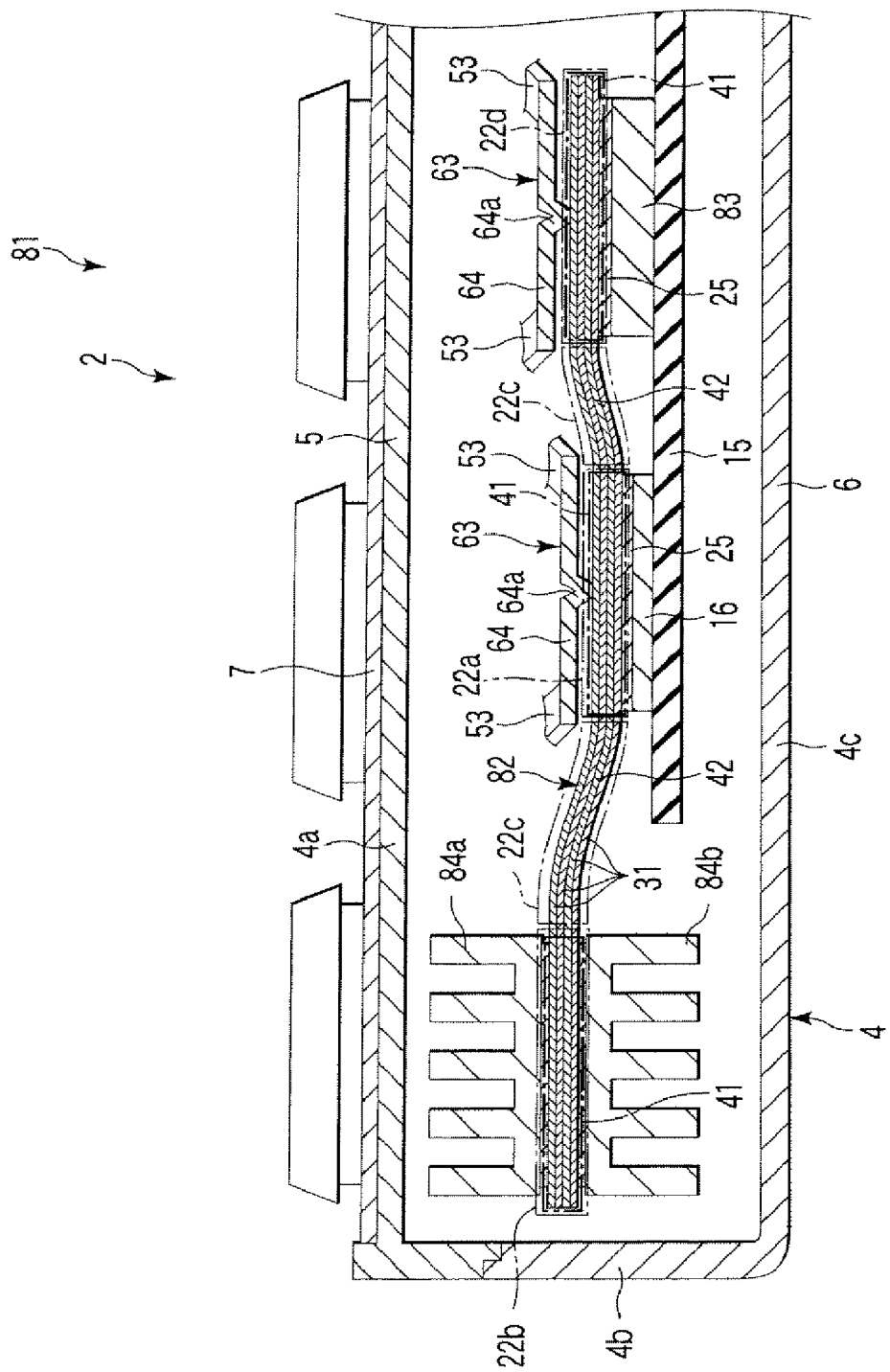
FIG. 9 is an exemplary cross-sectional view taken on line F9-F9 in the portable computer shown in FIG. 8.

As shown in FIGS. 8 and 9, a second heat generation body 83 is mounted on the printed circuit board 15. The heat generation body 83 may be the same type of a circuit component as the heat generation body 16 or a circuit component different from the latter. As shown in FIG. 9, the mounting height of the heat generation body 83 is different from that of the heat generation body 16. The heat generation body 16 and the heat generation body 83 have parts common difference.

As shown in FIGS. 8 and 9, the portable computer 81 is provided with a cooling fan 21 located in the case 4 and a pair of radiator 84a and 84b. The radiators 84a and 84b in the embodiment take one form of a cooling member in the invention, respectively. The radiators 84a and 84b face the cooling fan 21. The cooling fan 21 blows air to the radiators 84a and 84b to cool the radiators 84a and 84b.

The heat conduction member 82 includes first and second heat receiving sections 22d and 22a, a heat radiation section 22b, and third sections 22c. One of the sections 22c is provided between the first heat receiving section 22d and the second heat receiving section 22a. The other section 22c is provided between the second heat receiving section 22a and the heat radiation section 22b.

The first heat receiving section 22d is opposed to the heat generation body 83 and is thermally connected to the heat generation body 83. The second heat receiving section 22a is opposed to the heat generation body 16 and is thermally connected to the heat generation body 16. The radiators 84a and 84b are located on the upper side and the lower side, respectively, with respect to the heat radiation section 22b. The radiators 84a and 84b are thermally connected to the heat radiation section 22b. A heat transfer member 25, for example, is interposed between each of the radiators 84a and 84b and the heat radiation section 22b.

In the heat conduction member 82 of the present embodiment, the joining portions 41 are provided in the first heat receiving section 22d, the second heat receiving section 22a, and the heat radiation section 22b, respectively. The sections 22c located between the first and second heat receiving sections 22d and 22a and between the second heat receiving section 22a and the heat radiation section 22b are non-joining portions 42, respectively. Those sections 22c are highly flexible.

In the portable computer 81 thus constructed, the heat conduction member 82 is flexible. Accordingly, the heat conduction member 82 has a good thermal conductivity, and is adjustable to the mounting heights of the heat generation bodies 16 and 83. In the case where the joining portions 41 are provided in the heat receiving sections 22d and 22a and the heat radiation section 22b, and the entire other section is the non-joining portion 42, flexibility of the heat conduction member 82 is further enhanced.

In the structural arrangement where the section 22c formed between the first and second heat receiving sections 22d and 22a is part of the non-joining portion 42, the heat conduction member 82 is adjustable to the different mounting heights of the heat generation bodies 16 and 83. Thus, the heat conduction member 82 itself is adjustable to the parts common difference to enable one heat conduction member 82 to promote the heat radiation of the heat generation bodies 16 and 83.

Use of the radiators 84a and 84b improves the heat radiation performance of the portable computer 81. In the case where the section 22c, which is formed between the second heat receiving section 22a and the heat radiation section 22b, is the non-joining portion 42, the heat conduction member 82 can absorb a height difference between each of the radiators 84a and 84b and the heat generation body 16.

It is not essential that two radiators are provided. If required, it is allowed for one radiator to be provided on only one side of the heat radiation section 22b.

Figure 10:
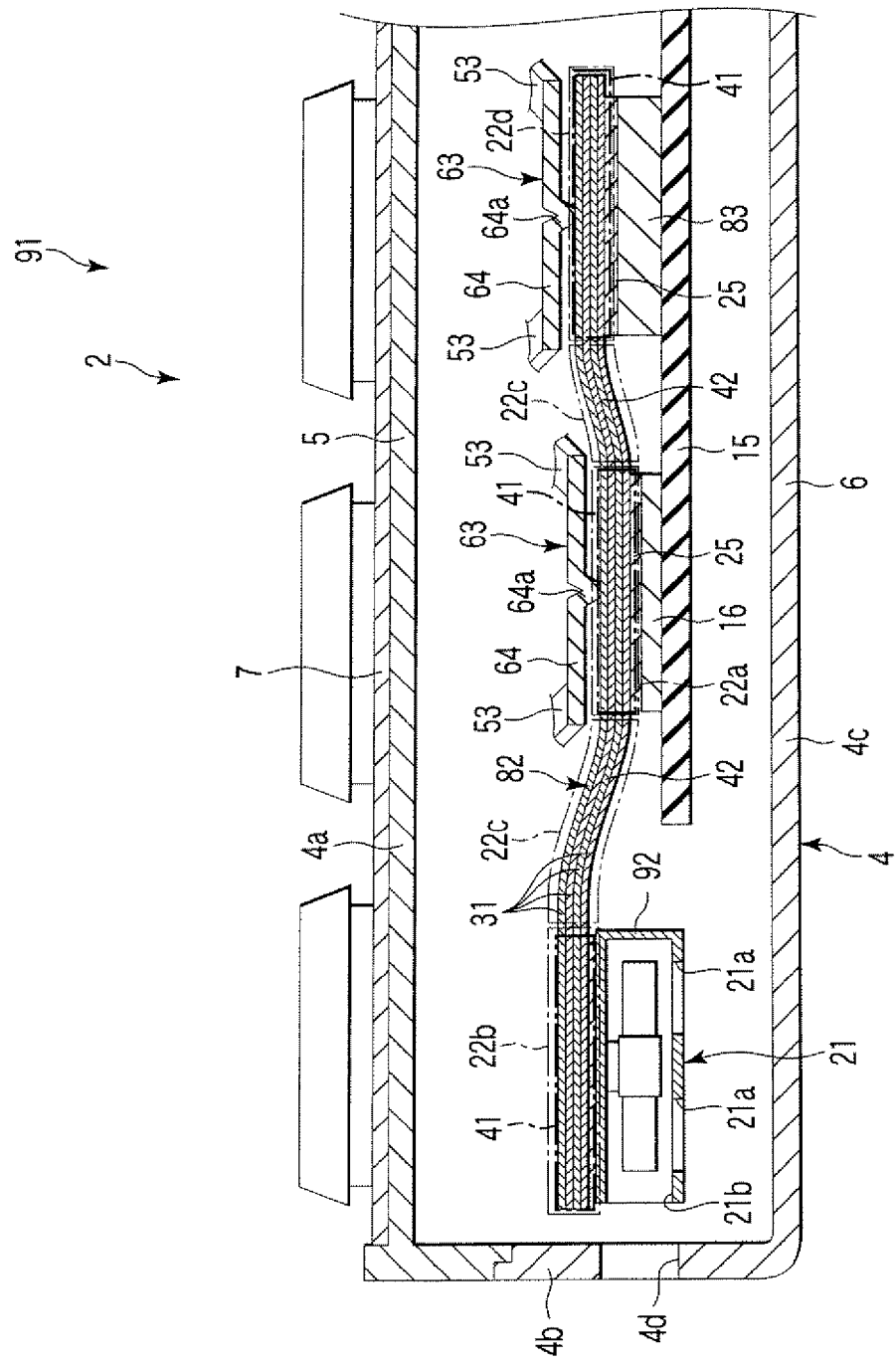
FIG. 10 is an exemplary cross-sectional view showing a portable computer according to a fifth embodiment of the present invention.

A portable computer 91 as an electronic device according to a fifth embodiment of the present invention will be described with reference to FIG. 10. In the fifth embodiment, like or equivalent portions will be designated by like reference numbers used in the portable computers 1, 61, 71 and 81 in the first to fourth embodiments, and the description thereof will be omitted.

The heat radiation section 22b of the heat conduction member 82 faces the cooling fan 21 and is thermally connected to a fan case 92 of the cooling fan 21. The heat conduction member 82 transfers heat received from the heat generation bodies 16 and 83 to the heat radiation section 22b. Part of the heat having reached the heat radiation section 22b is transferred to the cooling fan 21, and is radiated to the outside when the cooling fan 21 is driven.

In the portable computer 91 thus constructed, the heat conduction member 82 is flexible. Accordingly, the heat conduction member 82 has good thermal conductivity, and is adjustable to the mounting heights of the heat generation bodies 16 and 83.

A portable computer 101 as an electronic device according to a sixth embodiment of the present invention will be described with reference to FIG. 11. In the sixth embodiment, like or equivalent portions will be designated by like reference numbers used or the portable computers 1, 61, 71, 81, and 91 in the first to fifth embodiments, and the description thereof will be omitted.

Figure 11:
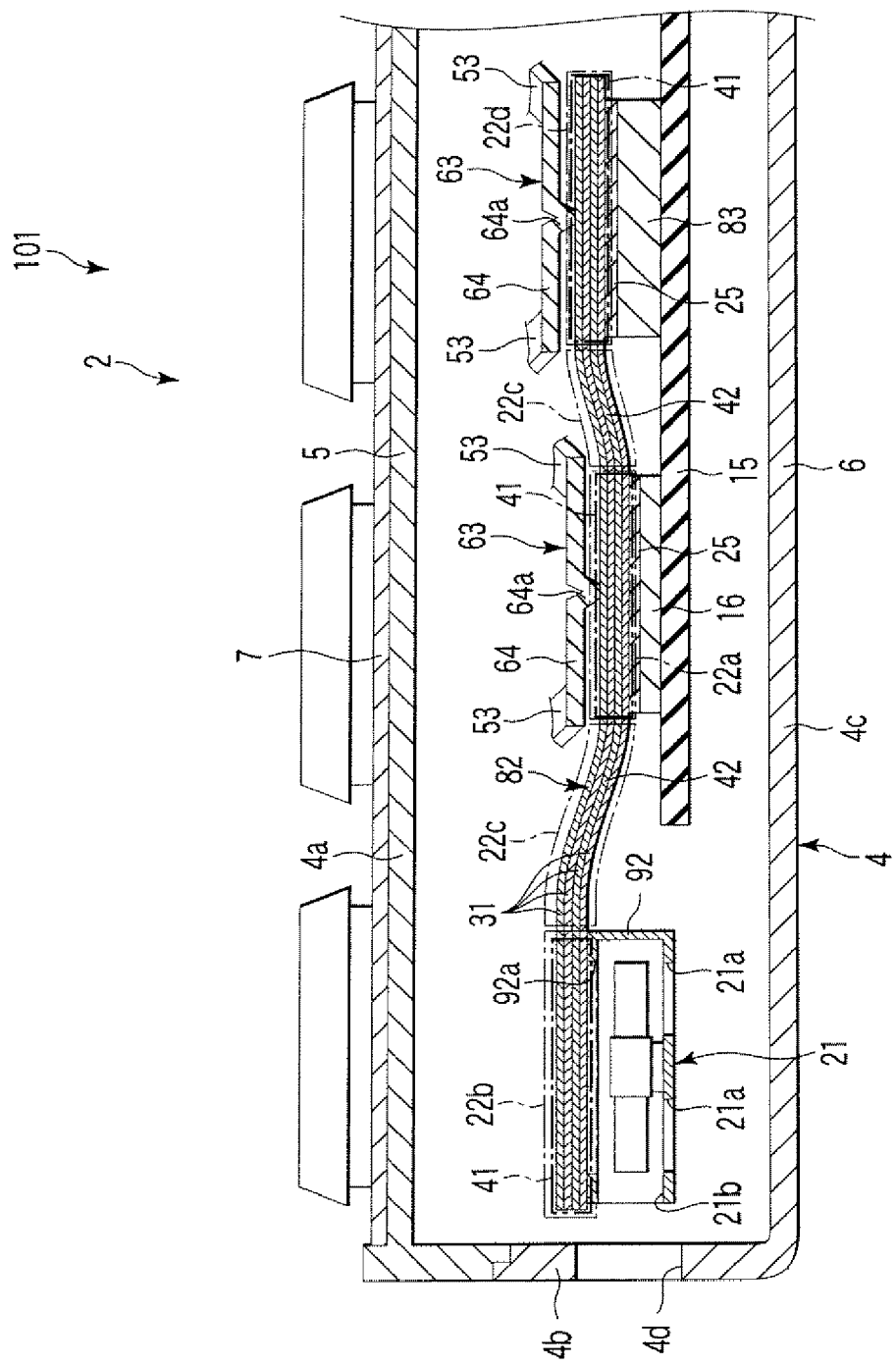
FIG. 11 is an exemplary cross-sectional view showing a portable computer according to a sixth embodiment of the present invention.

As shown in FIG. 11, the fan case 92 of the cooling fan 21 includes an opening 92a facing the heat conduction member 82. The heat radiation section 22b is attached to the fan case 92. The heat radiation section 22b of the heat conduction member 82 covers the opening 92a of the fan case 92 and faces the interior of the fan case 92 through the opening 92a. In other words, the heat radiation section 22b of the heat conduction member 82 forms a part of the fan case 92.

In the portable computer 101 having such a construction, the heat conduction member 82 is flexible. Accordingly, the heat conduction member 82 has good thermal conductivity, and is adjustable to the mounting heights of the heating members 16 and 83.

In the structural arrangement where the heat radiation section 22b of the heat conduction member 82 forms a part of the fan case 92, and faces the interior of the fan case 92, part of the heat having reached the heat radiation section 22b is transferred to air in an area in which the air-stream velocity is high, which flows around the fan blades (i.e., impeller). Therefore, the heat radiation efficiency is high. Accordingly, the present invention successfully provides the portable computer 101 which is capable of promoting the heat radiation from the heat generation body 16.

The heat conduction member 82 formed on the carbon sheet is usually fastened to the radiator by using a double-coated tape, adhesive or the like. The thermal conductivity of the adhesive or double-coated tape is not so high. In the case where the heat conduction member 82 is directly cooled by the cooling fan 21 as in the present embodiment, the heat radiation efficiency is increased.

A portable computer 111 as an electronic device according to a seventh embodiment of the present invention will be described with reference to FIG. 12. In the seventh embodiment, like or equivalent portions will be designated by like reference numbers used in the portable computers 1, 61, 71, 81, 91, and 101 in the first to sixth embodiments, and the description thereof will be omitted.

Figure 12:
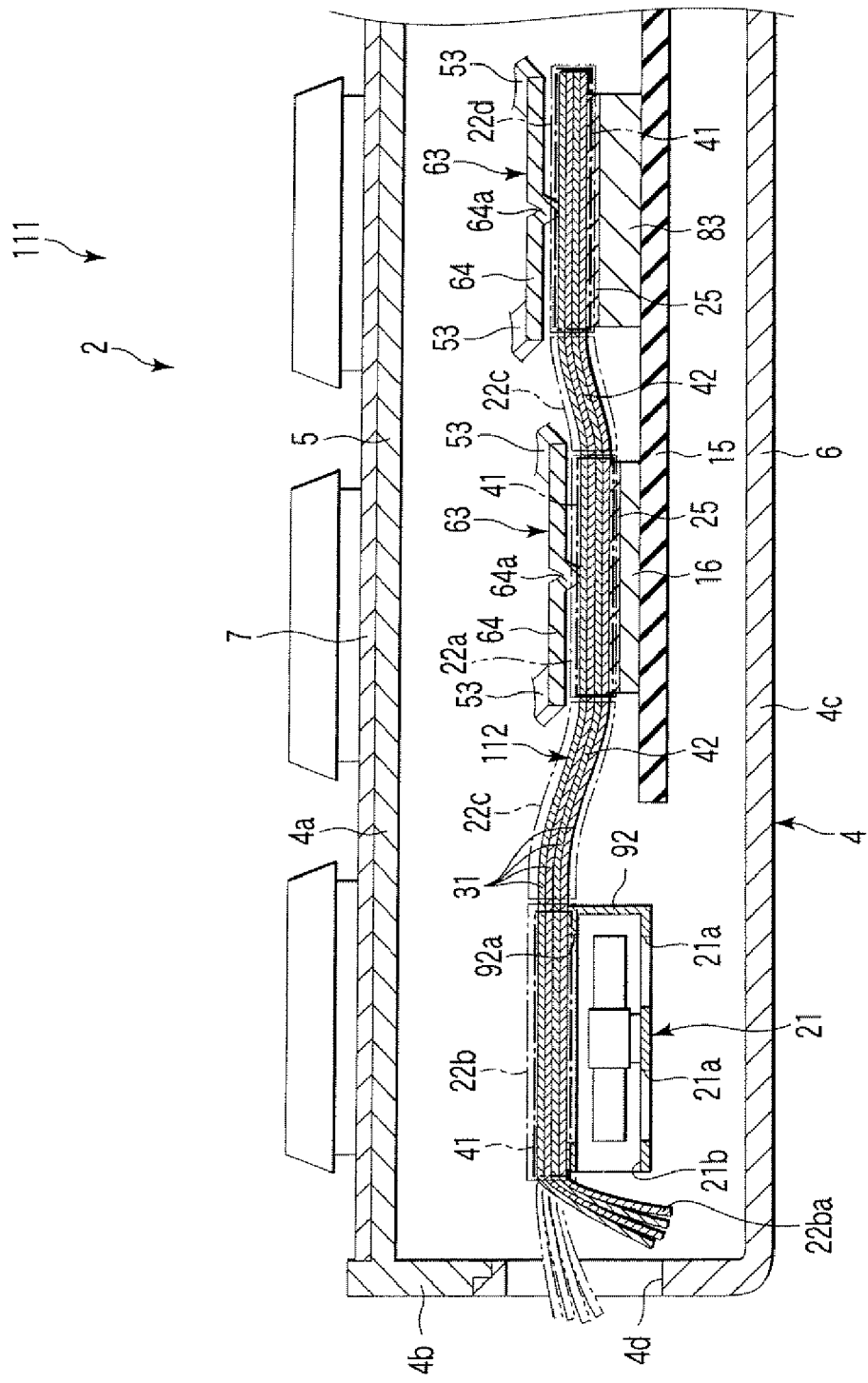
FIG. 12 is an exemplary cross-sectional view showing a portable computer according to a seventh embodiment of the present invention.

As shown in FIG. 12, tip portions 22ba of the heat radiation section 22b of a heat conduction member 112 hang down along the side surface of the cooling fan 21 and face the air exhaust port 21b of the cooling fan 21. The cooling fan 21 forcibly cools the tip portions 22ba of the heat radiation section 22b of the heat conduction member 112. Thus, the heat radiation section 22b of the heat conduction member 112 forms heat radiation fins. As indicated by two-dot chain lines in FIG. 12, in an example of the heat conduction member 112, when the cooling fan 21 is driven to start its operation, it is carried with the air stream discharged from the cooling fan 21 and a part of it veers to the air stream and flows to the outside of the case 4.

In the portable computer 111 having such a construction, the heat conduction member 112 is flexible. Accordingly, the heat conduction member 112 has good thermal conductivity, and is adjustable to the mounting heights of the heat generation bodies 16 and 83.

In the case where a metal radiator is additionally provided, adhesive interposed between the radiator and the heat conduction member 112 reduces the heat radiation efficiency. In the case where the heat conduction member 112 functions as the radiation fins as in the present embodiment, the heat radiation efficiency of the portable computer 111 is enhanced.

In a structural arrangement where the heat conduction member 112 as the heat radiation fins is flexible and when the cooling fan 21 is driven, it flows to the outside of the case 4 in the air stream, there is no need of securing a space to install the heat sink in the case 4 and this leads to size reduction of the portable computer 111. It is not essential that the tip portions 22ba of the heat radiation section 22b of the heat conduction member 112 flow to the outside of the case 4 in the air stream.

Figure 13:
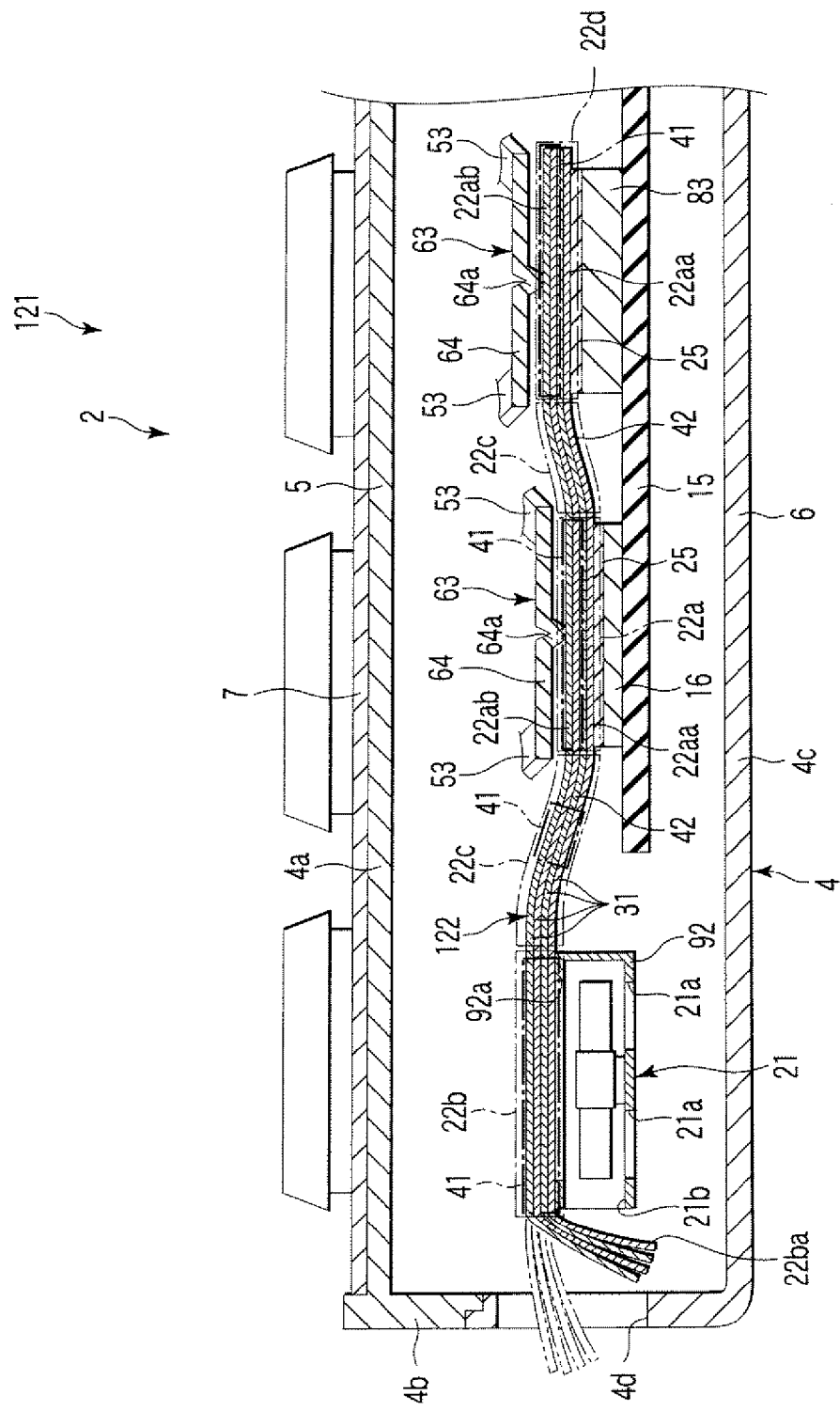
FIG. 13 is an exemplary cross-sectional view showing a portable computer according to an eighth embodiment of the present invention.

A portable computer 121 as an electronic device according to an eighth embodiment of the present invention will be described with reference to FIG. 13. In the eighth embodiment, like or equivalent portions will be designated by like reference numbers used in the portable computers 1, 61, 71, 81, 91, 101, and 111 in the first to seventh embodiments, and the description thereof will be omitted.

In a heat conduction member 122 of the present embodiment, the joining portion 41 contains the heat radiation section 22b, the second portions 22ab of the first and second heat receiving sections 22d and 22a, and a part of the section 22c formed between the second heat receiving section 22a and the heat radiation section 22b.

In the portable computer 121 having such a construction, the heat conduction member 122 is flexible. Accordingly, the heat conduction member 122 has good thermal conductivity, and is adjustable to the mounting heights of the heat generation bodies 16 and 83.

A portable computer 131 as an electronic device according to a ninth embodiment of the present invention will be described with reference to FIG. 14. In the ninth embodiment, like or equivalent portions will be designated by like reference numbers used or the portable computers 1, 61, 71, 81, 91, 101, 111, and 121 in the first to eighth embodiments, and the description thereof will be omitted.

In the heat conduction members 82, 112 and 122 of the fourth to seventh embodiments, the heat generation bodies 16 and 83 are connected to the heat conduction member in series. In the ninth embodiment, the heat generation bodies 16 and 83 are connected to the heat conduction member in parallel. The ninth embodiment thus constructed also produces the useful effects comparable to those of the embodiments mentioned above.

While the present invention has been described by using the first to ninth embodiments related to the portable computers 1, 61, 71, 81, 91, 101, 111, 121, and 131 and the heat conduction members 22, 62, 72, 82, 112, and 122, it is evident that the present invention is not limited to these embodiments. The constitutional components of the embodiments may be appropriately combined for applications.

One form of a heat conduction member of an electronic device includes a heat receiving section opposed to the heat generation body and thermally connected to a heat generation body, a heat radiation section opposed to a cooling member, and a section provided between the heat receiving section and the heat radiation section. The heat conduction member is formed by laminating a plurality of sheet members each having thermal conductivity. Those sheet members are joined together in at least one of the heat receiving section, the heat radiation section, and a portion of a section provided between the heat receiving section and the heat radiation section.

In the fourth to eighth embodiments, the joining portion 41 is provided in the heat receiving sections 22a and 22d, and the heat radiation section 22b. It suffices that the joining portion 41 is provided in at least one of those sections. The joining portion 41 may be provided only in a portion of each of the heat receiving sections 22a and 22d, or only in a portion of the heat radiation section 22b. The number of sheet members 31 forming each of the heat conduction members 22, 62, 72, 82, 112, and 122 is not limited to a specific number. Even if the whole section 22c is the joining portion 41, the heat conduction member is adjustable to the mounting height of the heat generation body 16 by, for example, deforming the heat receiving section 22a.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
a case;
a heat generation body in the case;
a cooling fan in the case, the cooling fan comprising an air exhaust port; and
a heat conduction member comprising (i) a heat receiving section opposed to the heat generation body and thermally connected to the heat generation body, (ii) a heat radiation section opposed to the air exhaust port of the cooling fan, and (iii) a section provided between the heat receiving section and the heat radiation section,
wherein the heat conduction member is formed by laminating a plurality of sheet members each having thermal conductivity, and the plurality of sheet members are joined together in a portion of the heat conduction member.

2. The electronic device of claim 1, wherein:
the cooling fan comprises a fan case provided with an opening facing the heat conduction member, and
the heat radiation section of the heat conduction member is attached to the fan case and covers the opening, the heat radiation section facing the interior of the fan case through the opening.

3. An electronic device comprising:
a case;
a heat generation body in the case;
a cooling fan in the case;
a radiator in the case, the radiator facing the cooling fan; and
a heat conduction member comprising a heat receiving section opposed to the heat generation body and thermally connected to the heat generation body, a heat radiation section opposed to the radiator and thermally connected to the radiator, and a section provided between the heat receiving section and the heat radiation section,
wherein the heat conduction member is formed by laminating a plurality of sheet members each having thermal conductivity, and the plurality of sheet members are joined together in a portion of the heat conduction member.

4. An electronic device comprising:
a case;
a heat generation body in the case;
a cooling member in the case; and
a heat conduction member comprising a heat receiving section opposed to the heat generation body, a heat radiation section opposed to the cooling member, and a section provided between the heat receiving section and the heat radiation section,
wherein the heat conduction member is formed by laminating a plurality of sheet members each having thermal conductivity, and the heat conduction member comprises a first part in which the sheet members are joined together, and a second part in which the sheet members are free from each other, the first part including at least a part of the section between the heat receiving section and the heat radiation section, and the second part including at least a part of the heat receiving section and at least a part of the heat radiation section.

5. The electronic device of claim 4, wherein
the sheet members are each configured to be deformable in the second part.

6. The electronic device of claim 4, wherein
the first part only includes a part of the section between the heat receiving section and the heat radiation section.

7. The electronic device of claim 4, wherein
the second part comprises a part of the section between the heat receiving section and the heat radiation section.

8. The electronic device of claim 4, wherein
the second part comprises an entire portion of each of the heat receiving section and the heat radiation section.

9. The electronic device of claim 4, wherein
the sheet members are not joined together in the second part.

10. The electronic device of claim 4, wherein
the first part comprises a part of the heat receiving section, in which some of the sheet members are joined together.

11. The electronic device of claim 4, further comprising
a pressing member which presses the heat receiving section of the heat conduction member toward the heat generation body.

12. The electronic device of claim 11, wherein
the heat receiving section comprises a first portion opposed to the heat generation body and a second portion opposed to the pressing member, and
the first part comprises the second portion of the heat receiving section.

13. The electronic device of claim 4, wherein
the cooling member is a cooling fan provided with an air exhaust port, and
a part of the heat radiation section of the heat conduction member faces the air exhaust port of the cooling fan.

14. The electronic device of claim 13, wherein
the cooling fan comprises a fan case provided with an opening facing the heat conduction member, and
the heat radiation section of the heat conduction member is attached to the fan case and covers the opening, the heat radiation section facing the interior of the fan case through the opening.

15. The electronic device of claim 4, further comprising:
a cooling fan in the case,
wherein the cooling member is a radiator facing the cooling fan, and the heat radiation section of the heat conduction member is thermally connected to the radiator.

16. The electronic device of claim 4, further comprising:
a second heat generation body in the case, the mounting height of the second heat generation body being different from that of the heat generation body,
wherein the heat conduction member comprises a second heat receiving section opposed to the second heat generation body, and
the second part including at least a part of the second heat receiving section.

* * * * *